US009567516B2

(12) United States Patent
Murphy et al.

(10) Patent No.: US 9,567,516 B2
(45) Date of Patent: *Feb. 14, 2017

(54) RED-EMITTING PHOSPHORS AND ASSOCIATED DEVICES

(71) Applicant: General Electric Company, Schenectady, NY (US)

(72) Inventors: James Edward Murphy, Niskayuna, NY (US); Anant Achyut Setlur, Niskayuna, NY (US); Florencio Garcia, Schenectady, NY (US); Srinivas Prasad Sista, Altamont, NY (US)

(73) Assignee: General Electric Company, Niskayuna, NY (US)

( * ) Notice: Subject to any disclaimer, the term of this patent is extended or adjusted under 35 U.S.C. 154(b) by 105 days.

This patent is subject to a terminal disclaimer.

(21) Appl. No.: 14/303,020

(22) Filed: Jun. 12, 2014

(65) Prior Publication Data

US 2015/0361335 A1    Dec. 17, 2015

(51) Int. Cl.
*C09K 11/61*    (2006.01)
*C09K 11/64*    (2006.01)
(Continued)

(52) U.S. Cl.
CPC ............ *C09K 11/616* (2013.01); *C09K 11/617* (2013.01); *F21K 9/60* (2016.08); *F21V 9/16* (2013.01); *H01L 33/502* (2013.01)

(58) Field of Classification Search
CPC ... C09K 11/616; C09K 11/617; C09K 11/675; C09K 11/628; C09K 11/645; C09K 11/665; C09K 11/0838; C09K 11/02; C09K 11/664; C09K 2211/181;C09K 2211/188; H01L 33/502; H01L 33/504; H01L 33/507; H01L 33/52; H05B 33/14; Y02B 20/181; Y10T 428/299
(Continued)

(56) References Cited

U.S. PATENT DOCUMENTS 2,522,074 A    9/1950    Urbach
3,576,756 A    4/1971    Russo
(Continued)

FOREIGN PATENT DOCUMENTS

CH    WO 2009077350 A1 *    6/2009    ........... C09K 11/664
CN    102827601 A    12/2012
(Continued)

OTHER PUBLICATIONS

Machine translation of JP2009/119486A, printed Nov. 27, 2015 (note that the machine translation cites as JP2009/119486 A, however this is a translation of the PCT document, WO2009/119486 A1).*
(Continued)

*Primary Examiner* — Matthew E Hoban
*Assistant Examiner* — Lynne Edmondson
(74) *Attorney, Agent, or Firm* — Mary Louise Stanford

(57) ABSTRACT

A process for synthesizing a manganese (Mn$^{4+}$) doped phosphor includes milling particles of the a phosphor precursor of formula I, and contacting the milled particles with a fluorine-containing oxidizing agent at an elevated temperature $$A_x[MF_y]:Mn^{4+} \quad (I)$$

wherein
A is Li, Na, K, Rb, Cs, or a combination thereof;
M is Si, Ge, Sn, Ti, Zr, Al, Ga, In, Sc, Hf, Y, La, Nb, Ta, Bi, Gd, or a combination thereof;
x is the absolute value of the charge of the [MF$_y$] ion;
y is 5, 6 or 7.

11 Claims, 3 Drawing Sheets

(51) Int. Cl.
*H01L 33/50* (2010.01)
*F21V 9/16* (2006.01)

(58) Field of Classification Search
USPC ...... 252/301.4 F, 301.4 H, 301.4 R, 301.6 F;
313/486, 503; 362/84, 97.1; 428/403;
257/98
See application file for complete search history.

(56) References Cited

U.S. PATENT DOCUMENTS

| | | | |
|---|---|---|---|
| 4,479,886 A | 10/1984 | Kasenga | |
| 6,103,296 A | 8/2000 | McSweeney | |
| 7,270,773 B2 | 9/2007 | Manivannan et al. | |
| 7,358,542 B2 | 4/2008 | Radkov et al. | |
| 7,422,703 B2 | 9/2008 | Yi et al. | |
| 7,497,973 B2 * | 3/2009 | Radkov ................ | C09K 11/617 252/301.4 F |
| 7,648,649 B2 | 1/2010 | Radkov et al. | |
| 7,847,309 B2 | 12/2010 | Radkov et al. | |
| 8,057,706 B1 * | 11/2011 | Setlur ................... | C09K 11/02 252/301.4 F |
| 8,252,613 B1 * | 8/2012 | Lyons ................... | C09K 11/617 438/45 |
| 8,362,685 B2 | 1/2013 | Masuda et al. | |
| 8,427,042 B2 | 4/2013 | Hata et al. | |
| 8,491,816 B2 | 7/2013 | Hong et al. | |
| 8,497,623 B2 | 7/2013 | Oguma et al. | |
| 8,593,062 B2 | 11/2013 | Murphy et al. | |
| 8,703,016 B2 | 4/2014 | Nammalwar et al. | |
| 8,710,487 B2 * | 4/2014 | Lyons ................... | C09K 11/617 257/13 |
| 8,906,724 B2 * | 12/2014 | Murphy ................ | H01L 33/502 438/34 |
| 2009/0001869 A1 | 1/2009 | Tanimoto et al. | |
| 2010/0090585 A1 | 4/2010 | Seto et al. | |
| 2010/0091215 A1 | 4/2010 | Fukunaga et al. | |
| 2011/0069490 A1 | 3/2011 | Liu | |
| 2012/0256125 A1 | 10/2012 | Kaneyoshi et al. | |
| 2012/0305972 A1 | 12/2012 | Meyer et al. | |
| 2013/0241396 A1 | 9/2013 | Hiramatsu et al. | |
| 2013/0264937 A1 | 10/2013 | Sakuta et al. | |
| 2013/0271960 A1 | 10/2013 | Hong et al. | |
| 2015/0069299 A1 | 3/2015 | Pan et al. | |

FOREIGN PATENT DOCUMENTS

| | | | | |
|---|---|---|---|---|
| CN | 102851026 A | | 1/2013 | |
| EP | 1807354 B1 | | 11/2008 | |
| EP | 2629341 A1 | | 8/2013 | |
| GB | 1360690 A | * | 7/1974 | .......... C09K 11/0833 |
| JP | WO 2009119486 A1 | * | 10/2009 | ........... C09K 11/616 |
| JP | 2013-014715 A | | 1/2013 | |
| JP | 2013-060506 A | | 4/2013 | |
| WO | 2009005035 A1 | | 1/2009 | |
| WO | 2009119486 A1 | | 10/2009 | |
| WO | 2011073951 A2 | | 6/2011 | |
| WO | 2013088313 A1 | | 6/2013 | |
| WO | 2013121355 A1 | | 8/2013 | |
| WO | 2013138347 A1 | | 9/2013 | |
| WO | 2013144919 A1 | | 10/2013 | |
| WO | 2013158929 A1 | | 10/2013 | |
| WO | 2014068440 A1 | | 5/2014 | |

OTHER PUBLICATIONS

Frayret et al., "Solubility of (NH4)2SiF6, K2SiF6 and Na2SiF6 in acidic solutions", Chemical Physics Letters, Aug. 2006, pp. 356-364, vol. 427, Issue 4.

Paulusz, "Efficient Mn(IV) Emission in Fluorine Coordination", Journal of the Electrochemical Society, Jul. 1973, pp. 942-947, vol. 120, Issue 7.

Liao et al.,"Synthesis of K2SiF6:Mn4+ Phosphor from SiO2 Powders via Redox Reaction in HF/KMnO4 Solution and Their Application in Warm-White LED", Journal of the American Ceramic Society, Wiley online library, Nov. 2013, vol. 96, Issue 11, pp. 3552-3556.

Hu et al., "Preparation and luminescent properties of (Ca1-x,Srx)S:Eu2+ red-emitting phosphor for white LED", Journal of Luminescence, ScienceDirect, Feb. 1, 2005,vol. 111, Issue 3, pp. 139-145.

Kasa et al.,"Red and Deep Red Emissions from Cubic K2SiF6:Mn4+ and Hexagonal K2MnF6 Synthesized in HF/KMnO4/KHF2/Si Solutions", Journal of the Electrochemical Society, ECS, 2012, vol. 159, issue 4, J89-J95.

Murphy et al., "Color Stable Red-Emitting Phosphors", U.S. Appl. No. 14/208,592, filed Mar. 13, 2014.

Murphy et al., "Color Stable Red-Emitting Phosphors", U.S. Appl. No. 14/285,746, filed May 23, 2014.

Nammalwar et al., "Phosphor Materials and Related Devices", U.S. Appl. No. 14/348,244, filed Mar. 28, 2014.

Murphy et al., "Method and System for Storage of Perishable Items", U.S. Appl. No. 13/665,514, filed Oct. 31, 2012.

Brewster et al., "Phosphor Assembly for Light Emitting Devices", U.S. Appl. No. 13/875,534, filed May 2, 2013.

Murphy et al., "Color Stable Red-Emitting Phosphors", U.S. Appl. No. 61/791,511, filed Mar. 15, 2013.

General Electric Company, "Color Stable Red-Emitting Phosphors", PCT Patent Application PCT/US14/027733, filed Mar. 14, 2014.

Murphy, "Processes for Preparing Color Stable Manganese-Doped Phosphors", U.S. Appl. No. 61/868,633, filed Aug. 22, 2013.

Setlur et al., "LED Package With Red-Emitting Phosphors", U.S. Appl. No. 14/073,141, filed Nov. 6, 2013.

Murphy et al., "Processes for Preparing Color Stable Manganese-Doped Complex Fluoride Phosphors", U.S. Appl. No. 61/915,927, filed Dec. 13, 2013.

Bera et al., "Optimization of the Yellow Phosphor Concentration and Layer Thickness for Down-Conversion of Blue to White Light", Journal of Display Technology, pp. 645-651, vol. 6, No. 12, Dec. 2010.

Setlur et al., "Color Stable Red-Emitting Phosphors", U.S. Appl. No. 14/302,823, filed Jun. 12, 2014.

Setlur et al., "LED Package With Red-Emitting Phosphors", U.S. Appl. No. 14/304,098, filed Jun. 13, 2014.

Garcia et al., "Color Stable Red-Emitting Phosphors", U.S. Appl. No. 14/302,907, filed Jun. 12, 2014.

Takahashi et al., "Mn4+-Activated Red Photoluminescence in K2SiF6 Phosphor", Journal of the Electrochemical Society, pp. E183-E188, vol. 155, Issue 12, 2008.

International Search Report and Written Opinion dated Jul. 14, 2014 which was issued in connection with PCT Patent Application No. PCT/US2014/027733.

Black et al., "Excitation and luminescence spectra of dipotassium hexafluoromanganate(IV)", Journal of the Chemical Society, Royal Society of Chemistry, Dalton Transactions, 1974, 977-981, Issue 9.

* cited by examiner

RED-EMITTING PHOSPHORS AND ASSOCIATED DEVICES

BACKGROUND

Red-emitting phosphors based on complex fluoride materials activated by $Mn^{4+}$, such as those described in U.S. Pat. No. 7,358,542, U.S. Pat. No. 7,497,973, and U.S. Pat. No. 7,648,649, can be utilized in combination with yellow/green emitting phosphors such as YAG:Ce or other garnet compositions to achieve warm white light (CCTs<5000 K on the blackbody locus, color rendering index (CRI)>80) from a blue LED, equivalent to that produced by current fluorescent, incandescent and halogen lamps. These materials absorb blue light strongly and efficiently emit between about 610-635 nm with little deep red/NIR emission. Therefore, luminous efficacy is maximized compared to red phosphors that have significant emission in the deeper red where eye sensitivity is poor. Quantum efficiency can exceed 85% under blue (440-460 nm) excitation.

While the efficacy and CRI of lighting systems using $Mn^{4+}$ doped fluoride hosts can be quite high, one potential limitation is their susceptibility to degradation under high temperature and humidity (HTHH) conditions. It is possible to reduce this degradation using post-synthesis processing steps, as described in U.S. Pat. No. 8,252,613. However, further improvement in stability of the materials is desirable.

BRIEF DESCRIPTION

Briefly, in one aspect, the present invention relates to a process for synthesizing a manganese ($Mn^{4+}$) doped phosphor. A phosphor precursor of formula I is milled to a desired particle size and then contacted with a fluorine-containing oxidizing agent at an elevated temperature to form the $Mn^{4+}$ doped phosphor $$A_x[MF_y]:Mn^{4+} \qquad (I)$$

wherein

A is Li, Na, K, Rb, Cs, or a combination thereof;

M is Si, Ge, Sn, Ti, Zr, Al, Ga, In, Sc, Hf, Y, La, Nb, Ta, Bi, Gd, or a combination thereof;

x is the absolute value of the charge of the $[MF_y]$ ion;

y is 5, 6 or 7.

In another aspect, the present invention relates to the $Mn^{4+}$ doped phosphors that may be produced by the process, and lighting apparatuses and backlight devices that include the $Mn^{4+}$ doped phosphors.

DRAWINGS

These and other features, aspects, and advantages of the present invention will become better understood when the following detailed description is read with reference to the accompanying drawings in which like characters represent like parts throughout the drawings, wherein.

DETAILED DESCRIPTION

Figure 1:
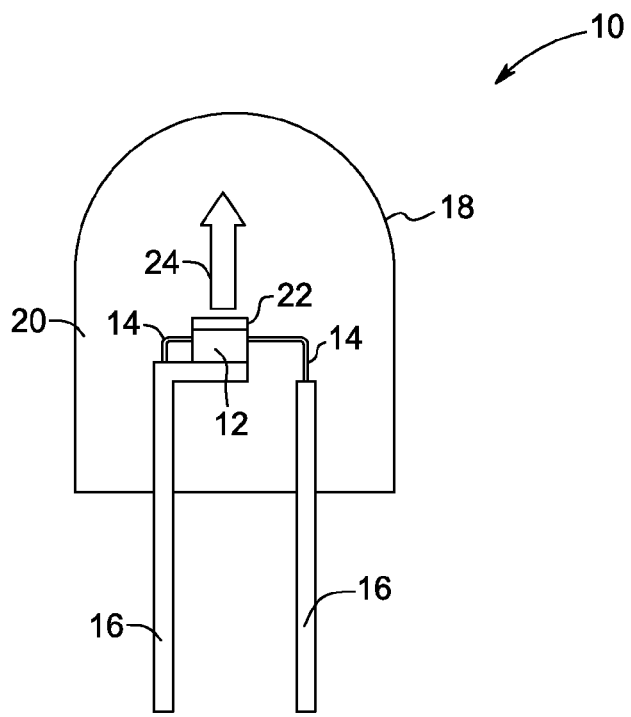
FIG. 1 is a schematic cross-sectional view of a lighting apparatus in accordance with one embodiment of the invention.

Approximating language, as used herein throughout the specification and claims, may be applied to modify any quantitative representation that could permissibly vary without resulting in a change in the basic function to which it is related. Accordingly, a value modified by a term or terms, such as "about," is not limited to the precise value specified. In some instances, the approximating language may correspond to the precision of an instrument for measuring the value. In the following specification and claims, the singular forms "a", "an" and "the" include plural referents, unless the context clearly dictates otherwise.

In the processes according to the present invention, a phosphor precursor is milled followed by treating the milled particles to enhance performance and stability (quantum efficiency, thermal stability, humidity stability, and light flux stability) of the resulting $Mn^{4+}$ doped phosphor. The phosphor precursor is milled (or ground) to reduce particle size for desired properties. For example, as the particle size of the phosphor is reduced, the sedimentation rate (or settling rate) of the particles in an encapsulant material (for example, silicone) decreases. By controlling the particle size and particle size distribution, the sedimentation rate of the particles can be tuned to match, be slower or be faster than other phosphors in a blend, and thus enables control over the separation of phosphors. The separation of phosphors can be beneficial to protect the $Mn^{4+}$ doped phosphors from damage caused by the excitation flux. In addition, the amount and the location (closer or farther from an LED chip) of the phosphor particles can be controlled in order to achieve a desired color point. Moreover, small particle size (D50 particle size less than 30 microns) may allow the use of simple deposition techniques, for example spray coating techniques.

The phosphor precursor is a manganese ($Mn^{4+}$)-doped complex fluoride material of formula I. In the context of the present invention, the term "complex fluoride material or phosphor", means a coordination compound, containing at least one coordination center, surrounded by fluoride ions acting as ligands, and charge-compensated by counter ions as necessary. In one example, $K_2SiF_6:Mn^{4+}$, the coordination center is Si and the counter ion is K. Complex fluorides are occasionally written down as a combination of simple, binary fluorides but such a representation does not indicate the coordination number for the ligands around the coordination center. The square brackets (occasionally omitted for simplicity) indicate that the complex ion they encompass is a new chemical species, different from the simple fluoride ion. The activator ion ($Mn^{4+}$) also acts as a coordination center, substituting part of the centers of the host lattice, for example, Si. The host lattice (including the counter ions) may further modify the excitation and emission properties of the activator ion.

In particular embodiments, the coordination center of the precursor, that is, M in formula I, is Si, Ge, Sn, Ti, Zr, or a combination thereof. More particularly, the coordination center is Si, Ge, Ti, or a combination thereof, and the counter ion, or A in formula I, is Na, K, Rb, Cs, or a combination thereof, and y is 6. Examples of precursors of formula I include $K_2[SiF_6]:Mn^{4+}$, $K_2[TiF_6]:Mn^{4+}$, $K_2[SnF_6]:Mn^{4+}$, $Cs_2[TiF_6]:Mn^{4+}$, $Rb_2[TiF_6]:Mn^{4+}$, $Cs_2[SiF_6]:Mn^{4+}$, $Rb_2[SiF_6]:Mn^{4+}$, $Na_2[TiF_6]:Mn^{4+}$, $Na_2[ZrF_6]:Mn^{4+}$, $K_3[ZrF_7]:Mn^{4+}$, $K_3[BiF_6]:Mn^{4+}$, $K_3[YF_6]:Mn^{4+}$, $K_3[LaF_6]:Mn^{4+}$, $K_3[GdF_6]:Mn^{4+}$, $K_3[NbF_7]:Mn^{4+}$, $K_3[TaF_7]:Mn^{4+}$. In particular embodiments, the precursor of formula I is $K_2SiF_6$:$Mn^{4+}$.

The phosphor precursor can be milled by milling techniques as known in the art. Non-limiting examples of milling techniques may include planetary milling, attrition milling, ball milling, air jet milling, pulveriser techniques, or a combination thereof. In a particular embodiment, the phosphor precursor is ball milled. Other milling (or grinding) techniques may be used, which provide reduced particle size (for example a D50 particle size less than about 30 microns). In one embodiment, the milling is performed in a vacuum or in an inert environment. Thus, it is to be understood that any method of reducing the particle size of the phosphor precursor through these mechanical means, will not depart from the scope of this invention.

Milling or grinding particles of the phosphor precursor of formula I is carried out for a selected period of time with a rotational speed that depends, in part, on the size of the particles of particles before milling, along with the desired size of the resulting particles after milling. In one embodiment, the particles have a particle size distribution with a D50 value (or a D50 particle size) of less than about 30 microns after milling. In particular embodiments, the D50 particle size of the milled particles ranges from about 10 microns to about 20 microns, and more particularly from about 12 microns to about 18 microns.

In some embodiments, a liquid medium can be used for milling. The liquid medium may include ketones, such as acetone, alcohols, esters, such as t-butyl acetate, water, acids, or mixtures thereof. During milling, the phosphor compositions of formula I usually react with the liquid medium via hydrolysis and oxidation-reduction reactions, and exhibit a decrease in their performance. For example, Table 1 shows the drop in quantum efficiency of $K_2[SiF_6]$:$Mn^{4+}$ (PFS) with time when milled with acetone. In addition to the sensitivity of the phosphors of formula I to many liquid mediums, milling may also introduce defects into the phosphor precursor of formula I, and thereby lowering the performance of the resulting phosphor.

Alternately, when dry milling in dry air or other environments, the breaking of phosphor particles increases the susceptibility of these particles to hydrolysis and oxidation-reduction reactions with moisture in the air. This also can lower the performance of the phosphor.

Thus, according to the embodiments of the present invention, after milling, the particles are treated to enhance performance and stability (quantum efficiency, thermal stability, humidity stability, flux stability, and color stability) of the resulting $Mn^{4+}$ doped phosphor. In one embodiment, the milled particles are contacted with a fluorine-containing oxidizing agent in gaseous form at an elevated temperature.

The temperature at which the particles are contacted with the fluorine-containing oxidizing agent is any temperature in the range from about 200° C. to about 700° C., particularly from about 350° C. to about 600° C. during contact, and in some embodiments from about 200° C. to about 700° C. In various embodiments of the present invention, the temperature is at least 100° C., particularly at least 225° C., and more particularly at least 350° C. The phosphor precursor particles are contacted with the oxidizing agent for a period of time sufficient to increase its performance and stability of the resulting phosphor. Time and temperature are interrelated, and may be adjusted together, for example, increasing time while reducing temperature, or increasing temperature while reducing time. In particular embodiments, the time is at least one hour, particularly for at least four hours, more particularly at least six hours, and most particularly at least eight hours.

After holding at the elevated temperature for the desired period of time, the temperature may be reduced at a controlled rate while maintaining the oxidizing atmosphere for an initial cooling period. After the initial cooling period, the cooling rate may be controlled at the same or a different rate, or may be uncontrolled. In some embodiments, the cooling rate is controlled at least until a temperature of 200° C. is reached. In other embodiments, the cooling rate is controlled at least until a temperature at which it is safe to purge the atmosphere is reached. For example, the temperature may be reduced to about 50° C. before a purge of the fluorine atmosphere begins.

Reducing the temperature at a controlled rate of ≤5° C. per minute may yield a phosphor product having superior properties compared to reducing the temperature at a rate of 10° C./minute. In various embodiments, the rate may be controlled at ≤5° C. per minute, particularly at ≤3° C. per minute, more particularly at a rate of ≤1° C. per minute.

The period of time over which the temperature is reduced at the controlled rate is related to the contact temperature and cooling rate. For example, when the contact temperature is 540° C. and the cooling rate is 10° C./minute, the time period for controlling the cooling rate may be less than one hour, after which the temperature may be allowed to fall to the purge or ambient temperature without external control. When the contact temperature is 540° C. and the cooling rate is ≤5° C. per minute, then the cooling time may be less than two hours. When the contact temperature is 540° C. and the cooling rate is ≤3° C. per minute, then the cooling time may be less than three hours. When the contact temperature is 540° C. and the cooling rate is ≤1° C. per minute, then the cooling time is may be less than four hours. For example, the temperature may be reduced to about 200° C. with controlled cooling, then control may be discontinued. After the controlled cooling period, the temperature may fall at a higher or lower rate than the initial controlled rate.

The fluorine-containing oxidizing agent may be $F_2$, HF, $SF_6$, $BrF_5$, $NH_4HF_2$, $NH_4F$, KF, $AlF_3$, $SbF_5$, $ClF_3$, $BrF_3$, KrF, $XeF_2$, $XeF_4$, $NF_3$, $SiF_4$, $PbF_2$, $ZnF_2$, $SnF_2$, $CdF_2$ or a combination thereof. In particular embodiments, the fluorine-containing oxidizing agent is $F_2$. The amount of oxidizing agent in the atmosphere may be varied to obtain the stable phosphor particles, particularly in conjunction with variation of time and temperature. Where the fluorine-containing oxidizing agent is $F_2$, the atmosphere may include at least 0.5% $F_2$, although a lower concentration may be effective in some embodiments. In particular the atmosphere may include at least 5% $F_2$ and more particularly at least 20% $F_2$. The atmosphere may additionally include nitrogen, helium, neon, argon, krypton, xenon, in any combination with the fluorine-containing oxidizing agent. In a particular embodiment, the atmosphere is composed of about 20% $F_2$ and about 80% nitrogen.

The manner of contacting the milled particles with the fluorine-containing oxidizing agent is not critical and may be accomplished in any way sufficient to convert the precursor particles to a stable phosphor having the desired properties. In some embodiments, a chamber containing the precursor particles may be dosed and then sealed such that an overpressure develops as the chamber is heated, and in others, the fluorine and nitrogen mixture is flowed throughout the anneal process ensuring a more uniform pressure. In some embodiments, an additional dose of the fluorine-containing oxidizing agent may be introduced after a period of time.

In one embodiment, the milled particles are further treated with a saturated solution of a composition of formula II in aqueous hydrofluoric acid, as described in U.S. Pat. No. 8,252,613, after contacting the particles with the fluorine-containing oxidizing agent.

$$A_x[MF_y] \quad (II)$$

The temperature at which the phosphor is contacted with the solution ranges from about 20° C. to about 50° C. The period of time required to treat the phosphor ranges from about one minute to about five hours, particularly from about five minutes to about one hour. Concentration of hydrofluoric acid in the aqueous HF solutions ranges from about 20% w/w to about 70% w/w, particularly about 40% w/w to about 70% w/w. Less concentrated solutions may result in lower yields of the phosphor.

Any numerical values recited herein include all values from the lower value to the upper value in increments of one unit provided that there is a separation of at least 2 units between any lower value and any higher value. As an example, if it is stated that the amount of a component or a value of a process variable such as, for example, temperature, pressure, time and the like is, for example, from 1 to 90, preferably from 20 to 80, more preferably from 30 to 70, it is intended that values such as 15 to 85, 22 to 68, 43 to 51, 30 to 32 etc. are expressly enumerated in this specification. For values which are less than one, one unit is considered to be 0.0001, 0.001, 0.01 or 0.1 as appropriate. These are only examples of what is specifically intended and all possible combinations of numerical values between the lowest value and the highest value enumerated are to be considered to be expressly stated in this application in a similar manner.

In another aspect, the present invention relates to a process that includes milling particles of a phosphor precursor, and then contacting the milled precursor particles at an elevated temperature with a fluorine-containing oxidizing agent to form the $Mn^{4+}$ doped phosphor; the precursor is selected from the group consisting of (A) $A_2[MF_5]:Mn^{4+}$, where A is selected from Li, Na, K, Rb, Cs, and combinations thereof; and where M is selected from Al, Ga, In, and combinations thereof;

(B) $A_3[MF_6]:Mn^{4+}$, where A is selected from Li, Na, K, Rb, Cs, and combinations thereof; and where M is selected from Al, Ga, In, and combinations thereof;

(C) $Zn_2[MF_7]:Mn^{4+}$, where M is selected from Al, Ga, In, and combinations thereof;

(D) $A[In_2F_7]:Mn^{4+}$ where A is selected from Li, Na, K, Rb, Cs, and combinations thereof;

(E) $A_2[MF_6]:Mn^{4+}$, where A is selected from Li, Na, K, Rb, Cs, and combinations thereof; and where M is selected from Ge, Si, Sn, Ti, Zr, and combinations thereof;

(F) $E[MF_6]:Mn^{4+}$, where E is selected from Mg, Ca, Sr, Ba, Zn, and combinations thereof; and where M is selected from Ge, Si, Sn, Ti, Zr, and combinations thereof;

(G) $Ba_{0.65}Zr_{0.35}F_{2.70}:Mn^{4+}$; and (H) $A_3[ZrF_7]:Mn^{4+}$ where A is selected from Li, Na, K, Rb, Cs, and combinations thereof.

Time, temperature and fluorine-containing oxidizing agents for the process are described above.

The amount of manganese in the $Mn^{4+}$ doped precursors of formula I and groups (A)-(H), and in the product phosphors ranges from about 0.3 weight % (wt %) to about 2.5 wt %, (from about 1.2 mole % (mol %) to about 10 mol %), based on total weight of the precursor or phosphor. In some embodiments, the amount of manganese ranges from about 0.3 wt % to about 1.5 wt % (from about 1.2 mol % to about 6 mol %), particularly from about 0.50 wt % to about 0.85 wt % (from about 2 mol % to about 3.4 mol %), and more particularly from about 0.65 wt % to about 0.75 wt % (from about 2.6 mol % to about 3 mol %). In other embodiments, the amount of manganese ranges from about 0.75 wt %-2.5 wt % (about 3 mol % to about 10 mol %), particularly from about 0.9 wt % to 1.5 wt % (from about 3.5 mol % to about 6 mol %), more particularly from about 0.9 wt % to about 1.4 wt % (about 3.0 mol % to about 5.5 mol %), and even more particularly from about 0.9 wt % to about 1.3 wt % (about 3.5 mol % to about 5.1 mol %).

A lighting apparatus or light emitting assembly or lamp 10 according to one embodiment of the present invention is shown in FIG. 1. Lighting apparatus 10 includes a semiconductor radiation source, shown as light emitting diode (LED) chip 12, and leads 14 electrically attached to the LED chip. The leads 14 may be thin wires supported by a thicker lead frame(s) 16 or the leads may be self-supported electrodes and the lead frame may be omitted. The leads 14 provide current to LED chip 12 and thus cause it to emit radiation.

The lamp may include any semiconductor blue or UV light source that is capable of producing white light when its emitted radiation is directed onto the phosphor. In one embodiment, the semiconductor light source is a blue emitting LED doped with various impurities. Thus, the LED may comprise a semiconductor diode based on any suitable III-V, II-VI or IV-IV semiconductor layers and having an emission wavelength of about 250 to 550 nm. In particular, the LED may contain at least one semiconductor layer comprising GaN, ZnSe or SiC. For example, the LED may comprise a nitride compound semiconductor represented by the formula $In_iGa_jAl_kN$ (where $0 \le i$; $0 \le j$; $0 \le k$ and $I+j+k=1$) having an emission wavelength greater than about 250 nm and less than about 550 nm. In particular embodiments, the chip is a near-UV or blue emitting LED having a peak emission wavelength from about 400 to about 500 nm. Such LED semiconductors are known in the art. The radiation source is described herein as an LED for convenience. However, as used herein, the term is meant to encompass all semiconductor radiation sources including, e.g., semiconductor laser diodes. Further, although the general discussion of the exemplary structures of the invention discussed herein is directed toward inorganic LED based light sources, it should be understood that the LED chip may be replaced by another radiation source unless otherwise noted and that any reference to semiconductor, semiconductor LED, or LED chip is merely representative of any appropriate radiation source, including, but not limited to, organic light emitting diodes.

In lighting apparatus 10, phosphor material or composition 22 is radiationally coupled to the LED chip 12. Radiationally coupled means that the elements are associated with each other so radiation from one is transmitted to the other. Phosphor composition 22 is deposited on the LED 12 by any appropriate method. For example, a water based suspension of the phosphor(s) can be formed, and applied as a phosphor layer to the LED surface. In one such method, a silicone slurry in which the phosphor particles are randomly suspended is placed around the LED. This method is merely exemplary of possible positions of phosphor composition 22 and LED 12. Thus, phosphor composition 22 may be coated over or directly on the light emitting surface of the LED chip 12 by coating and drying the phosphor suspension over the LED chip 12. In the case of a silicone-based suspension, the suspension is cured at an appropriate temperature. Both the shell 18 and the encapsulant 20 should be transparent to allow white light 24 to be transmitted through those elements. Although not intended to be limiting, in some embodiments, the D50 particle size of the phosphor composition ranges from about 1 to about 50 microns, particularly from about 10 to about 35 microns.

In other embodiments, phosphor composition 22 is interspersed within the encapsulant material 20, instead of being formed directly on the LED chip 12. The phosphor (in the form of a powder) may be interspersed within a single region of the encapsulant material 20 or throughout the entire volume of the encapsulant material. Blue light emitted by the LED chip 12 mixes with the light emitted by phosphor composition 22, and the mixed light appears as white light. If the phosphor is to be interspersed within the material of encapsulant 20, then a phosphor powder may be added to a polymer or silicone precursor, and then the mixture may be cured to solidify the polymer or silicone material after or before loading the mixture on the LED chip 12. Examples of polymer precursors include thermoplastic or thermoset polymers or a resin, for example epoxy resin. Other known phosphor interspersion methods may also be used, such as transfer loading.

In some embodiments, the encapsulant material 20 have an index of refraction R, and, in addition to phosphor composition 22, contains a diluent material having less than about 5% absorbance and index of refraction of R±0.1. The diluent material has an index of refraction of ≤1.7, particularly ≤1.6, and more particularly ≤1.5. In particular embodiments, the diluent material is of formula II: $A_x[MF_y]$, and has an index of refraction of about 1.4. Adding an optically inactive material to the phosphor/silicone mixture may produce a more gradual distribution of light flux through the phosphor/encapsulant mixture and can result in less damage to the phosphor. Suitable materials for the diluent include fluoride compounds such as $LiF$, $MgF_2$, $CaF_2$, $SrF_2$, $AlF_3$, $K_2NaAlF_6$, $KMgF_3$, $CaLiAlF_6$, $K_2LiAlF_6$, and $K_2SiF_6$, which have index of refraction ranging from about 1.38 ($AlF_3$ and $K_2NaAlF_6$) to about 1.43 ($CaF_2$), and polymers having index of refraction ranging from about 1.254 to about 1.7. Non-limiting examples of polymers suitable for use as a diluent include polycarbonates, polyesters, nylons, polyetherimides, polyetherketones, and polymers derived from styrene, acrylate, methacrylate, vinyl, vinyl acetate, ethylene, propylene oxide, and ethylene oxide monomers, and copolymers thereof, including halogenated and unhalogenated derivatives. These polymer powders can be directly incorporated into silicone encapsulants before silicone curing.

In yet another embodiment, phosphor composition 22 is coated onto a surface of the shell 18, instead of being formed over the LED chip 12. The phosphor composition is preferably coated on the inside surface of the shell 18, although the phosphor may be coated on the outside surface of the shell, if desired. Phosphor composition 22 may be coated on the entire surface of the shell or only a top portion of the surface of the shell. The UV/blue light emitted by the LED chip 12 mixes with the light emitted by phosphor composition 22, and the mixed light appears as white light. Of course, the phosphor may be located in any two or all three locations or in any other suitable location, such as separately from the shell or integrated into the LED.

Figure 2:
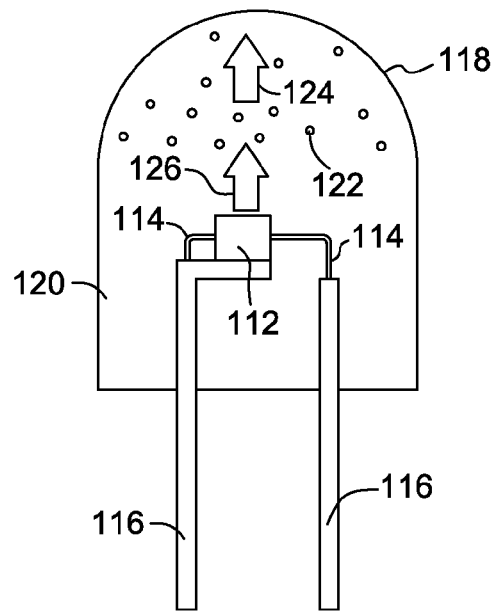
FIG. 2 is a schematic cross-sectional view of a lighting apparatus in accordance with another embodiment of the invention.

FIG. 2 illustrates a second structure of the system according to the present invention. Corresponding numbers from FIGS. 1-4 (e.g. 12 in FIGS. 1 and 112 in FIG. 2) relate to corresponding structures in each of the figures, unless otherwise stated. The structure of the embodiment of FIG. 2 is similar to that of FIG. 1, except that the phosphor composition 122 is interspersed within the encapsulant material 120, instead of being formed directly on the LED chip 112. The phosphor (in the form of a powder) may be interspersed within a single region of the encapsulant material or throughout the entire volume of the encapsulant material. Radiation (indicated by arrow 126) emitted by the LED chip 112 mixes with the light emitted by the phosphor 122, and the mixed light appears as white light 124. If the phosphor is to be interspersed within the encapsulant material 120, then a phosphor powder may be added to a polymer precursor, and loaded around the LED chip 112. The polymer or silicone precursor may then be cured to solidify the polymer or silicone. Other known phosphor interspersion methods may also be used, such as transfer molding.

Figure 3:
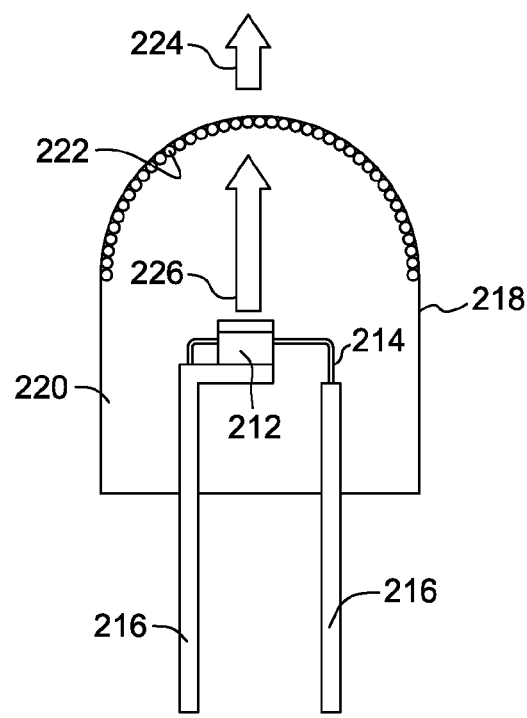
FIG. 3 is a schematic cross-sectional view of a lighting apparatus in accordance with yet another embodiment of the invention.

FIG. 3 illustrates a third possible structure of the system according to the present invention. The structure of the embodiment shown in FIG. 3 is similar to that of FIG. 1, except that the phosphor composition 222 is coated onto a surface of the envelope 218, instead of being formed over the LED chip 212. The phosphor composition 222 is preferably coated on the inside surface of the envelope 218, although the phosphor may be coated on the outside surface of the envelope, if desired. The phosphor composition 222 may be coated on the entire surface of the envelope, or only a top portion of the surface of the envelope. The radiation 226 emitted by the LED chip 212 mixes with the light emitted by the phosphor composition 222, and the mixed light appears as white light 224. Of course, the structures of FIGS. 1-3 may be combined, and the phosphor may be located in any two or all three locations, or in any other suitable location, such as separately from the envelope, or integrated into the LED.

In any of the above structures, the lamp may also include a plurality of scattering particles (not shown), which are embedded in the encapsulant material. The scattering particles may comprise, for example, alumina or titania. The scattering particles effectively scatter the directional light emitted from the LED chip, preferably with a negligible amount of absorption.

Figure 4:
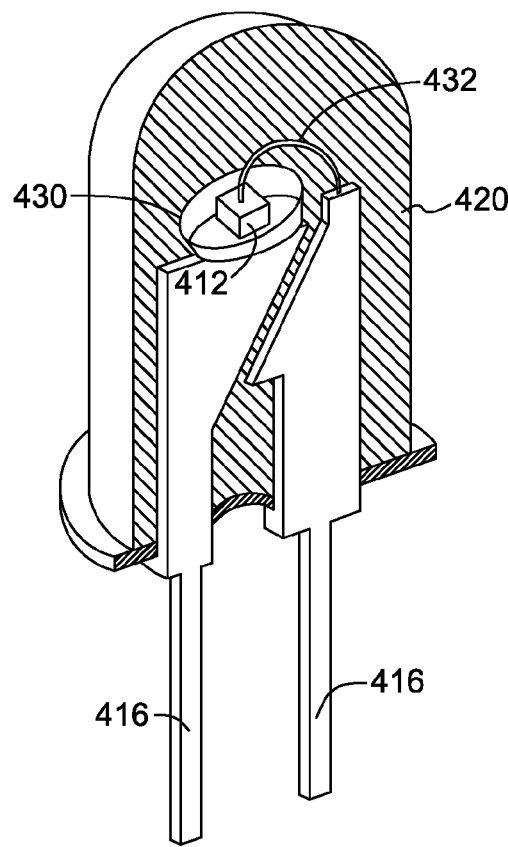
FIG. 4 is a cutaway side perspective view of a lighting apparatus in accordance with one embodiment of the invention.

As shown in a fourth structure in FIG. 4, the LED chip 412 may be mounted in a reflective cup 430. The cup 430 may be made from or coated with a dielectric material, such as alumina, titania, or other dielectric powders known in the art, or be coated by a reflective metal, such as aluminum or silver. The remainder of the structure of the embodiment of FIG. 4 is the same as those of any of the previous figures, and can include two leads 416, a conducting wire 432, and an encapsulant material 420. The reflective cup 430 is supported by the first lead 416 and the conducting wire 432 is used to electrically connect the LED chip 412 with the second lead 416.

Figure 5:
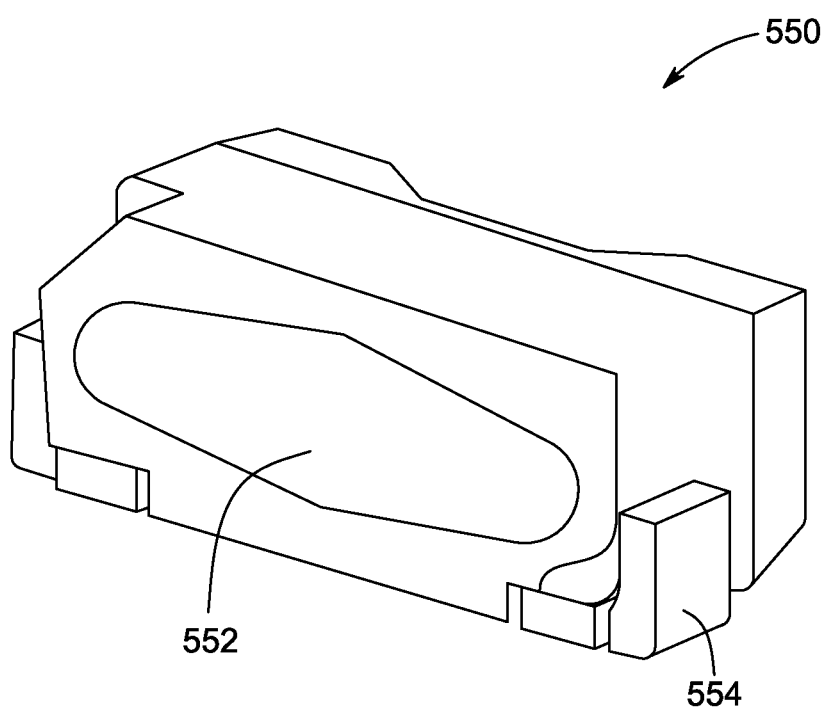
FIG. 5 is a schematic perspective view of a surface-mounted device (SMD) backlight LED.

Another structure (particularly for backlight applications) is a surface mounted device ("SMD") type light emitting diode 550, e.g. as illustrated in FIG. 5. This SMD is a "side-emitting type" and has a light-emitting window 552 on a protruding portion of a light guiding member 554. An SMD package may comprise an LED chip as defined above, and a phosphor material that is excited by the light emitted from the LED chip. Other backlight devices include, but are not limited to, TVs, computers, monitors, smartphones, tablet computers and other handheld devices that have a display including a semiconductor light source; and a $Mn^{4+}$ doped phosphor according to the present invention.

When used with an LED emitting at from 350 to 550 nm and one or more other appropriate phosphors, the resulting lighting system will produce a light having a white color. Lamp 10 may also include scattering particles (not shown), which are embedded in the encapsulant material. The scattering particles may comprise, for example, alumina or titania. The scattering particles effectively scatter the directional light emitted from the LED chip, preferably with a negligible amount of absorption.

In addition to the $Mn^{4+}$ doped phosphor, phosphor composition 22 may include one or more other phosphors. When used in a lighting apparatus in combination with a blue or near UV LED emitting radiation in the range of about 250 to 550 nm, the resultant light emitted by the assembly will be a white light. Other phosphors such as green, blue, yellow, red, orange, or other color phosphors may be used in the blend to customize the white color of the resulting light and produce specific spectral power distributions. Other materials suitable for use in phosphor composition 22 include electroluminescent polymers such as polyfluorenes, preferably poly(9,9-dioctyl fluorene) and copolymers thereof, such as poly(9,9'-dioctylfluorene-co-bis-N,N'-(4-butylphenyl)diphenylamine) (F8-TFB); poly(vinylcarbazole) and polyphenylenevinylene and their derivatives. In addition, the light emitting layer may include a blue, yellow, orange, green or red phosphorescent dye or metal complex, or a combination thereof. Materials suitable for use as the phosphorescent dye include, but are not limited to, tris(1-phenylisoquinoline) iridium (III) (red dye), tris(2-phenylpyridine) iridium (green dye) and Iridium (III) bis(2-(4,6-difluorephenyl)pyridinato-N,C2) (blue dye). Commercially available fluorescent and phosphorescent metal complexes from ADS (American Dyes Source, Inc.) may also be used. ADS green dyes include ADS060GE, ADS061GE, ADS063GE, and ADS066GE, ADS078GE, and ADS090GE. ADS blue dyes include ADS064BE, ADS065BE, and ADS070BE. ADS red dyes include ADS067RE, ADS068RE, ADS069RE, ADS075RE, ADS076RE, ADS067RE, and ADS077RE.

Suitable phosphors for use in phosphor composition 22 include, but are not limited to:
$((Sr_{1-z} (Ca, Ba, Mg, Zn)_z)_{1-(x+w)}(Li, Na, K, Rb)_w Ce_x)_3 (Al_{1-y}Si_y)O_{4+y+3(x-w)}F_{1-y-3(x-w)}$, $0<x\leq0.10$, $0\leq y\leq 0.5$, $0\leq z\leq 0.5$, $0\leq w\leq x$; $(Ca, Ce)_3 Sc_2 Si_3 O_{12}$ (CaSiG); $(Sr,Ca,Ba)_3 Al_{1-x} Si_x O_4 + _x F_{1-x}:Ce^{3+}$ (SASOF)); $(Ba,Sr,Ca)_5 (PO_4)_3(Cl,F,Br,OH):Eu^{2+}$, $Mn^{2+}$; $(Ba,Sr,Ca)BPO_5:Eu^{2+}$, $Mn^{2+}$; $(Sr,Ca)_{10}(PO_4)_6*vB_2O_3:Eu^{2+}$ (wherein $0<v\leq1$); $Sr_2Si_3O_8*2SrCl_2:Eu^{2+}$; $(Ca,Sr,Ba)_3 MgSi_2 O_8:Eu^{2+}$, $Mn^{2+}$; $BaAl_8O_{13}:Eu^{2+}$; $2SrO*0.84P_2O_5*0.16B_2O_3:Eu^{2+}$; $(Ba,Sr,Ca)MgAl_{10}O_{17}:Eu^{2+}$, $Mn^{2+}$; $(Ba,Sr,Ca)Al_2O_4:Eu^{2+}$; $(Y,Gd,Lu,Sc,La)BO_3:Ce^{3+}$, $Tb^{3+}$; $ZnS:Cu^+$, $Cl^-$; $ZnS:Cu^+$, $Al^{3+}$; $ZnS:Ag^+$, $Cl^-$; $ZnS:Ag^+$, $Al^{3+}$; $(Ba,Sr,Ca)_2 Si_{1-\xi} O_{4-2\xi}:Eu^{2+}$ (wherein $-0.2\leq\xi\leq0.2$); $(Ba,Sr,Ca)_2(Mg,Zn)Si_2O_7:Eu^{2+}$; $(Sr,Ca,Ba)(Al,Ga,In)_2S_4:Eu^{2+}$; $(Y,Gd,Tb,La,Sm,Pr,Lu)_3 (Al,Ga)_{5-\alpha}O_{12-3/2\alpha}:Ce^{3+}$ (wherein $0\leq\alpha\leq0.5$); $(Ca,Sr)_8(Mg,Zn)(SiO_4)_4Cl_2:Eu^{2+}$, $Mn^{2+}$; $Na_2Gd_2B_2O_7:Ce^{3+}$, $Tb^{3+}$; $(Sr,Ca,Ba,Mg,Zn)_2P_2O_7:Eu^{2+}$, $Mn^{2+}$; $(Gd,Y,Lu,La)_2O_3:Eu^{3+}$, $Bi^{3+}$; $(Gd,Y,Lu,La)_2O_2S:Eu^{3+}$, $Bi^{3+}$; $(Gd,Y,Lu,La)VO_4:Eu^{3+}$, $Bi^{3+}$; $(Ca,Sr)S:Eu^{2+}$, $Ce^{3+}$; $SrY_2S_4:Eu^{2+}$; $CaLa_2S_4:Ce^{3+}$; $(Ba,Sr,Ca)MgP_2O_7:Eu^{2+}$, $Mn^{2+}$; $(Y,Lu)_2WO_6:Eu^{3+}$, $Mo^{6+}$; $(Ba,Sr,Ca)_\beta Si_\gamma N_\mu:Eu^{2+}$ (wherein $2\beta+4\gamma=3\mu$); $(Ba,Sr,Ca)_2Si_{5-x}Al_xN_{6-x}O_x:Eu^{2+}$ (wherein $0\leq x\leq2$); $Ca_3(SiO_4)Cl_2:Eu^{2+}$; $(Lu,Sc,Y,Tb)_{2-u-v}Ce_vCa_{1+u}Li_wMg_{2-w}P_w(Si,Ge)_{3-w}O_{12-u/2}$ (where $0.5\leq u\leq 1$, $0<v\leq0.1$, and $0\leq w\leq0.2$); $(Y,Lu,Gd)_{2-\phi}Ca_\phi Si_4 N_{6+\phi} C_{1-\phi}:Ce^{3+}$, (wherein $0\leq\phi\leq0.5$); $(Lu,Ca,Li,Mg,Y)$, $\alpha$-SiAlON doped with $Eu^{2+}$ and/or $Ce^{3+}$; $(Ca,Sr,Ba)SiO_2N_2:Eu^{2+}$, $Ce^{3+}$; $\beta$-SiAlON:$Eu^{2+}$, $3.5MgO*0.5MgF_2*GeO_2:Mn^{4+}$; $(Sr,Ca,Ba)AlSiN_3:Eu^{2+}$; $(Sr,Ca,Ba)_3SiO_5:Eu^{2+}$; $Ca_{1-c-f}Ce_cEu_fAl_{1+c}Si_{1-c}N_3$, (where $0\leq c\leq0.2$, $0\leq f\leq0.2$); $Ca_{1-h-r}Ce_hEu_rAl_{1-h}(Mg,Zn)_hSiN_3$, (where $0\leq h\leq 0.2$, $0\leq r\leq 0.2$); $Ca_{1-2s-t}Ce_s(Li,Na)_sEu_tAlSiN_3$, (where $0\leq s\leq 0.2$, $0\leq f\leq 0.2$, $s+t>0$); and $Ca_{1-\sigma-\chi-\phi}Ce_\sigma(Li,Na)_\chi Eu_\phi Al_{1+\sigma-\chi}Si_{1-\sigma+\chi}N_3$, (where $0\leq\sigma\leq0.2$, $0\leq\chi\leq0.1$, $0\leq\phi\leq0.2$).

The ratio of each of the individual phosphors in the phosphor blend may vary depending on the characteristics of the desired light output. The relative proportions of individual phosphors in the various embodiment phosphor blends may be adjusted such that when their emissions are blended and employed in an LED lighting device, there is produced visible light of predetermined x and y values on the CIE chromaticity diagram. As stated, a white light is preferably produced. This white light may, for instance, may possess an x value in the range of about 0.20 to about 0.55, and a y value in the range of about 0.20 to about 0.55. As stated, however, the exact identity and amounts of each phosphor in the phosphor composition can be varied according to the needs of the end user. For example, the material can be used for LEDs intended for liquid crystal display (LCD) backlighting. In this application, the LED color point would be appropriately tuned based upon the desired white, red, green, and blue colors after passing through an LCD/color filter combination. The list of potential phosphor for blending given here is not meant to be exhaustive and these $Mn^{4+}$-doped phosphors can be blended with various phosphors with different emission to achieve desired spectral power distributions.

The $Mn^{4+}$ doped phosphors of the present invention may be used in applications other than those described above. For example, the material may be used as a phosphor in a fluorescent lamp, in a cathode ray tube, in a plasma display device or in a liquid crystal display (LCD). The material may also be used as a scintillator in an electromagnetic calorimeter, in a gamma ray camera, in a computed tomography scanner or in a laser. These uses are merely exemplary and not limiting.

EXAMPLES

The examples that follow are merely illustrative, and should not be construed to be any sort of limitation on the scope of the claimed invention.

Manganese ($Mn^{4+}$) doped $K_2SiF_6$ were synthesized according to a procedure described in the referenced U.S. Pat. No. 7,497,973, in a HF solution with a drying temperature of about 70 degrees Celsius.

72.6 microns D50 particles of $K_2SiF_6:Mn^{4+}$ were ball milled in acetone for 20 minutes. Table 1 shows a drop in quantum efficiency of $K_2SiF_6:Mn^{4+}$ after milling for 5 minutes and 20 minutes as compared to the as-synthesized $K_2SiF_6:Mn^{4+}$.

TABLE 1

| Sample milling period (minutes) | D50 particle size (microns) | QE (relative) | Abs |
|---|---|---|---|
| 0 (As-synthesized) | 72.6 | 100% | 90% |
| 5 | 61.7 | 94% | 89% |
| 20 | 22.3 | 86% | 70% |

Example 1

15 g of manganese-doped potassium fluorosilicate (PFS: Mn) precursor, $K_2SiF_6:Mn^{4+}$ having particles of D50 particle size of 46 microns and containing 0.76 wt % Mn based on total weight of the precursor material, was added to 250 milliliters nalgene bottle containing dry milling media and sealed in the bottle. The bottle was placed on a roller mill for 15 minutes. The milled precursor was removed from the bottle, which had D50 particles of 16 microns.

The milled precursor particles were then placed in a furnace chamber. The furnace chamber was evacuated and was filled with an atmosphere containing 20% $F_2$/80% $N_2$. The chamber was then heated up to 540° C. After annealing the precursor for 8 hours, the chamber was cooled to room temperature. The fluorine nitrogen mixture was evacuated; the chamber was filled and purged several times with nitrogen to ensure the complete removal of fluorine gas before opening the chamber. The annealed PFS powder was then treated with a saturated solution of $K_2SiF_6$ by placing the powder (~10 g) in a Teflon beaker containing 100 mL of a saturated solution of $K_2SiF_6$ (initially made by adding ~5 g of $K_2SiF_6$ in 40% HF at room temperature, stirring, and filtering the solution). The suspension was stirred slowly, filtered, washed in acetone 3-5 times and the filtrate was dried under vacuum.

Example 2

15 g of manganese-doped potassium fluorosilicate (PFS: Mn) precursor, $K_2SiF_6$:$Mn^{4+}$ having particles of D50 particle size of 46 microns and containing 0.76 wt % Mn based on total weight of the precursor material, was added to 250 milliliters nalgene bottle containing dry milling media and sealed in the bottle. The bottle was placed on a roller mill for 15 minutes. The milled precursor was removed from the bottle, which had D50 particles between 24 microns and 30 microns. Table 2 shows that after milling the QE of the PFS:Mn precursor was decreased.

The milled precursor particles were then placed in a furnace chamber. The furnace chamber was evacuated and was filled with an atmosphere containing 20% $F_2$/80% $N_2$. The chamber was then heated up to 540° C. After annealing the precursor for 8 hours, the chamber was cooled to room temperature. The fluorine nitrogen mixture was evacuated; the chamber was filled and purged several times with nitrogen to ensure the complete removal of fluorine gas before opening the chamber. The annealed PFS powder was then treated (wet treatment) with a saturated solution of $K_2SiF_6$ by placing the powder (~10 g) in a Teflon beaker containing 100 mL of a saturated solution of $K_2SiF_6$ (initially made by adding ~5 g of $K_2SiF_6$ in 40% HF at room temperature, stirring, and filtering the solution). The suspension was stirred slowly, filtered, washed in acetone 3-5 times and the filtrate was dried under vacuum.

Table 2 shows quantum efficiency (QE) and stability (tested under conditions of high flux) of the PFS samples of example 1 and example 2 along with a commercially available phosphor of $K_2SiF_6$:Mn (Comparative example). The milled and post-treated sample showed increased quantum efficiency (QE) and lifetime, and experienced significantly less damage compared to the PFS of the comparative example as well as as-synthesized PFS sample. It was also observed for example 2 that annealing improved QE of the PFS powder by 23%-28%, decreased the absorbance at 300 nm, and increased the lifetime. Furthermore, the wet treatment improved the HTHH (high temperature high humidity) stability. HTHH damage or loss was improved from more than 45% to less than 10%.

TABLE 2

| Sample | | Particle size D50 (μm) | QE (%) | LD (%) | Lifetime (ms) | Power Red (mW) |
|---|---|---|---|---|---|---|
| Comparative Example | | 27 | 100 | 7 | 8.6 | 76 |
| Example 1 | As synthesized PFS | 46 | 97 | — | 8.35 | — |
| | Milled/post treated | 16 | 104 | 1.4 | 8.9 | 93 |

| Sample | | D10/D50/D90 | QE (%) | LD (%) | Lifetime (ms) | HTHH loss |
|---|---|---|---|---|---|---|
| Example 2 | As synthesized PFS | 14/58/67 | 87.9% | 8.146 | 8.146 | |
| | Milled | | 80.8% | 8.142 | 8.142 | 54% |
| | Milled/post treated | 18/28/39 | 103.0% | 8.698 | 8.698 | 7% |

While only certain features of the invention have been illustrated and described herein, many modifications and changes will occur to those skilled in the art. It is, therefore, to be understood that the appended claims are intended to cover all such modifications and changes as fall within the true spirit of the invention.

The invention claimed is:

1. A process for synthesizing a manganese doped phosphor, the process comprising:
dry milling particles of a phosphor precursor of formula I; and $$A_x[MF_y]:Mn^{4+} \qquad (I)$$

contacting the dry milled particles with a fluorine-containing oxidizing agent in gaseous form at an elevated temperature, the fluorine-containing oxidizing agent comprising $F_2$, $SF_6$, $BrF_5$, $NH_4HF_2$, $NH_4F$, KF, $AlF_3$, $SbF_5$, $ClF_3$, $BrF_3$, KrF, $XeF_2$, $XeF_4$, $NF_3$, $SiF_4$, $PbF_2$, $ZnF_2$, $SnF_2$, $CdF_2$ or combinations thereof; and
wherein,
A is Li, Na, K, Rb, Cs, or a combination thereof;
M is Si, Ge, Sn, Ti, Zr, Al, Ga, In, Sc, Hf, Y, La, Nb, Ta, Bi, Gd, or a combination thereof;
x is 1, 2, or 3 and is equal to the absolute value of the charge of the $[MF_y]$ ion;
y is 5, 6 or 7.

2. The process according to claim 1, wherein M is Si, Ge, Sn, Ti, Zr, or a combination thereof.

3. The process according to claim 1, wherein the particles of the phosphor precursor of formula I have a particle size distribution of a D50 value less than about 30 microns after the dry milling step.

4. The process according to claim 1, wherein the particles of the phosphor precursor of formula I have a particle size distribution of a D50 value ranging from about 10 microns to about 25 microns after the dry milling step.

5. The process according to claim 1, wherein the fluorine-containing oxidizing agent comprises $F_2$.

6. The process according to claim 1, wherein the dry milled particles are contacted with the fluorine-containing oxidizing agent at a temperature in a range from about 500° C. to about 600° C.

7. The process according to claim 1, wherein the dry milled particles are contacted with the fluorine-containing oxidizing agent for at least four hours.

8. The process according to claim 1, additionally comprising contacting the dry milled particles with a saturated solution of a compound of formula II in aqueous hydrofluoric acid after contacting the dry milled particles with the fluorine-containing oxidizing agent $$A_x[MF_y] \qquad (II).$$

9. The process according to claim 1, wherein
A is Na, K, Rb, Cs, or a combination thereof;
M is Si, Ge, Ti, or a combination thereof; and Y is 6.

10. The process according to claim 1, wherein the phosphor precursor is $K_2SiF_6:Mn^{4+}$.

11. A process for synthesizing a manganese doped phosphor, the process comprising:
dry milling particles of a phosphor precursor, wherein the precursor is selected from the group consisting of
(A) $A_2[MF_5]:Mn^{4+}$, where A is selected from Li, Na, K, Rb, Cs, and combinations thereof; and where M is selected from Al, Ga, In, and combinations thereof;
(B) $A_3[MF_6]:Mn^{4+}$, where A is selected from Li, Na, K, Rb, Cs, and combinations thereof; and where M is selected from Al, Ga, In, and combinations thereof;
(C) $Zn_2[MF_7]:Mn^{4+}$, where M is selected from Al, Ga, In, and combinations thereof;
(D) $A[In_2F_7]:Mn^{4+}$ where A is selected from Li, Na, K, Rb, Cs, and combinations thereof;
(E) $A_2[MF_6]:Mn^{4+}$, where A is selected from Li, Na, K, Rb, Cs, and combinations thereof; and where M is selected from Ge, Si, Sn, Ti, Zr, and combinations thereof;
(F) $E[MF_6]:Mn^{4+}$, where E is selected from Mg, Ca, Sr, Ba, Zn, and combinations thereof; and where M is selected from Ge, Si, Sn, Ti, Zr, and combinations thereof;
(G) $Ba_{0.65}Zr_{0.35}F_{2.70}:Mn^{4+}$; and
(H) $A_3[ZrF_7]:Mn^{4+}$ where A is selected from Li, Na, K, Rb, Cs and combinations thereof, and
contacting the dry milled particles with a fluorine-containing oxidizing agent in gaseous form at an elevated temperature, the fluorine-containing oxidizing agent comprising $F_2$, $SF_6$, $BrF_5$, $NH_4HF_2$, $NH_4F$, $KF$, $AlF_3$, $SbF_5$, $ClF_3$, $BrF_3$, $KrF$, $XeF_2$, $XeF_4$, $NF_3$, $SiF_4$, $PbF_2$, $ZnF_2$, $SnF_2$, $CdF_2$ or combinations thereof.

* * * * *